(12) United States Patent
Kupershmidt et al.

(10) Patent No.: US 9,648,417 B2
(45) Date of Patent: May 9, 2017

(54) ENERGY EFFICIENT CHARGE REUSE IN DRIVING CAPACITIVE LOADS

(71) Applicant: DSP Group LTD., Herzeliya (IL)

(72) Inventors: Haim Kupershmidt, Or Yehuda (IL); Moti Margalit, Zichron Yaaqov (IL)

(73) Assignee: DSP GROUP LTD., Herzliya (IL)

( * ) Notice: Subject to any disclaimer, the term of this patent is extended or adjusted under 35 U.S.C. 154(b) by 0 days.

(21) Appl. No.: 15/072,428

(22) Filed: Mar. 17, 2016

(65) Prior Publication Data

US 2016/0277832 A1 Sep. 22, 2016

Related U.S. Application Data

(60) Provisional application No. 62/135,178, filed on Mar. 19, 2015.

(51) Int. Cl.
*H04R 3/00* (2006.01)
*H04R 19/02* (2006.01)

(52) U.S. Cl.
CPC .............. *H04R 3/00* (2013.01); *H04R 3/005* (2013.01); *H04R 19/02* (2013.01); *H04R 2201/003* (2013.01)

(58) Field of Classification Search
CPC ........................................................ H04R 3/00
See application file for complete search history.

(56) References Cited

U.S. PATENT DOCUMENTS 8,861,752 B2\* 10/2014 Margalit .................. H04R 1/22
381/152
2016/0274141 A1\* 9/2016 Enjalbert .............. G01P 15/125

\* cited by examiner

*Primary Examiner* — Olisa Anwah
(74) *Attorney, Agent, or Firm* — Reches Patents (57) ABSTRACT

A method of charge reuse, the method may include repeating the steps of: electrically coupling a first group of capacitive loads to a second group of capacitive loads; wherein the capacitive loads of the first group and of the second group are Microelectromechanical systems (MEMS) capacitive loads or Nanoelectromechanical systems (NEMS) capacitive loads; charging the second group with a first charge provided from the first group; electrically disconnecting the first group from the second group; operating the second group while using the first charge; electrically coupling the first group to the second group; charging the first group with a second charge provided from the second group; electrically disconnecting the first group from the second group; and operating the first group while using the second charge.

20 Claims, 10 Drawing Sheets

ENERGY EFFICIENT CHARGE REUSE IN DRIVING CAPACITIVE LOADS

RELATED APPLICATIONS

This application claims priority from U.S. Provisional Patent Application Ser. No. 62/135,178 filing date Mar. 19, 2015 which is being incorporated herein by reference.

BACKGROUND OF THE INVENTION

U.S. Pat. No. 8,861,752 discloses a speaker array. The speaker array may include a first speaker cell and a second speaker cell. The first speaker cell includes a first membrane and a first shutter. The second speaker cell includes a second membrane and a second shutter. The first membrane may be configured to oscillate in a first directional path and at a first frequency effective to generate a first ultrasonic acoustic signal. The first shutter may be positioned above the first membrane and configured to modulate the first ultrasonic acoustic signal such that a first audio signal is generated. The second membrane may be configured to oscillate in the first directional path and at a second frequency effective to generate a second ultrasonic acoustic signal. The second shutter may be positioned above the second membrane and configured to modulate the second ultrasonic acoustic signal such that a second audio signal is generated.

Figure 1:
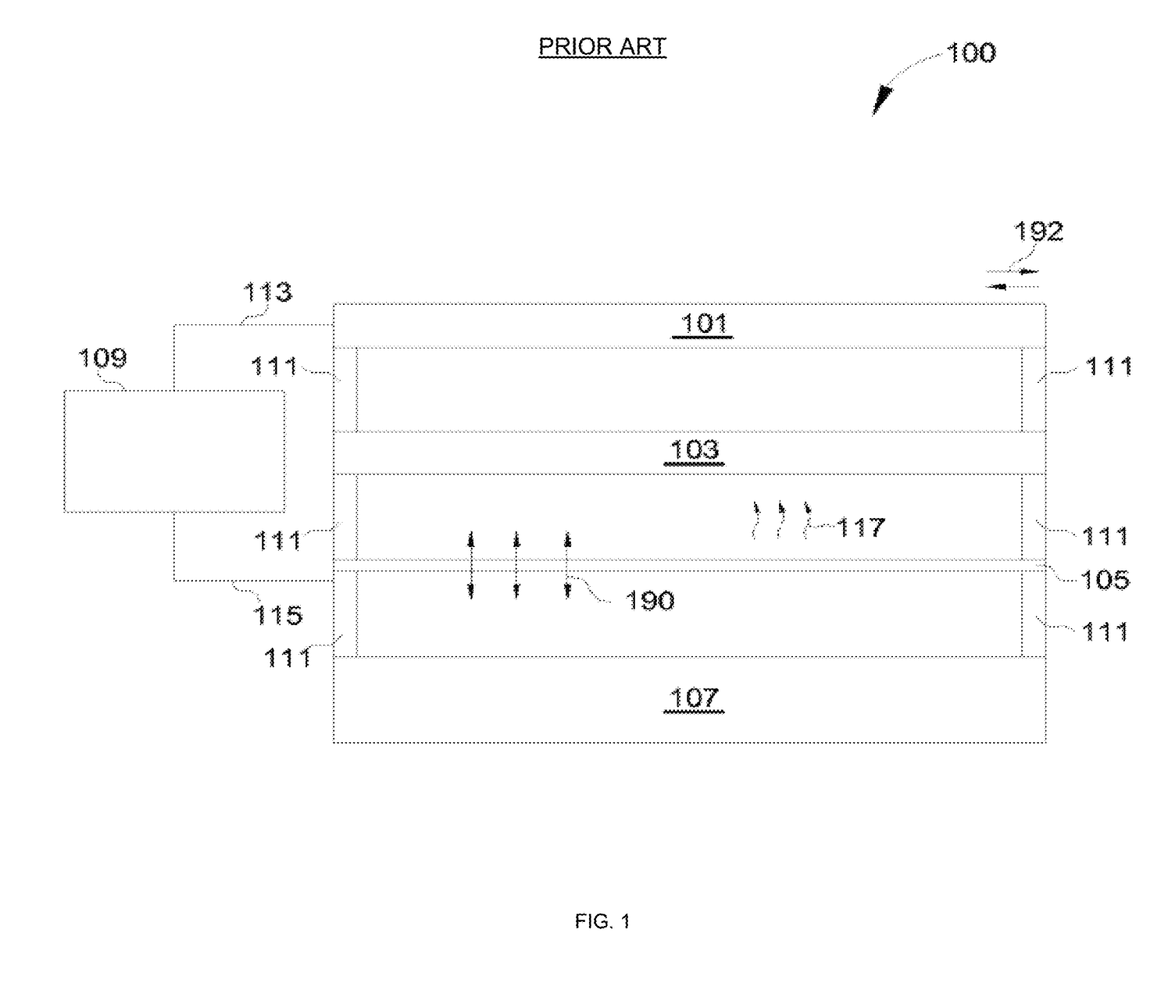
FIG. 1 is a cross sectional view of a prior art speaker 100.

FIG. 1 is a cross sectional view of a prior art speaker cell 100. Speaker cell device 100 includes shutter 101, blind 103, membrane 105, substrate 107, controller 109, and spacers 111. Speaker device based on an array of such cells (100) may be a micro electro mechanical system (MEMS) and as small as 3 mm×3 mm. Therefore, speaker device may be suitable for mobile devices because of its compact size. Substrate 107 can be a silicon substrate of a micro electro mechanical system. Spacers 111 can be configured to separate shutter 101, blind 103, membrane 105, and substrate 107.

Membrane 105 can be electrically coupled to controller 109. Controller 109 can be configured to apply a first signal 115 to membrane 105. In response to first signal 115, membrane 105 can oscillate along a directional path 190 effective to generate ultrasonic acoustic wave 117. Ultrasonic acoustic wave 117 may propagate along the directional path 190 from membrane 105 towards blind 103 and shutter 101.

In some examples, first alternating signal 115 may be a voltage or a current that alternates according to a first frequency. In some other examples, first alternating signal 115 may be some other variety of periodically changing signal such as a current or voltage that may be sinusoidal, pulsed, ramped, triangular, linearly changing, non-linearly changing, or some combination thereof. The oscillation frequency of membrane 105 can be substantially proportional to the frequency of first alternating signal 115. Therefore, by applying different alternating signals 115, controller 109 can control the oscillation frequency of membrane 105.

Blind 103 can be positioned above membrane 105 and below shutter 101. Blind 103 can include a first set of rectangular openings (not shown). Ultrasonic acoustic wave 117 passes through the openings of blind 103 through to shutter 101.

Shutter 101 is electrically coupled to controller 109. Controller 109 can be configured to apply a second signal 113 to shutter 101. In response to second signal 113, shutter 101 can move along a directional path 192 between a first position and a second position. Shutter 101 includes a second set of openings (not shown). The relationship and orientation of the first set of openings relative to the second set of openings will be further described below.

Figure 2:
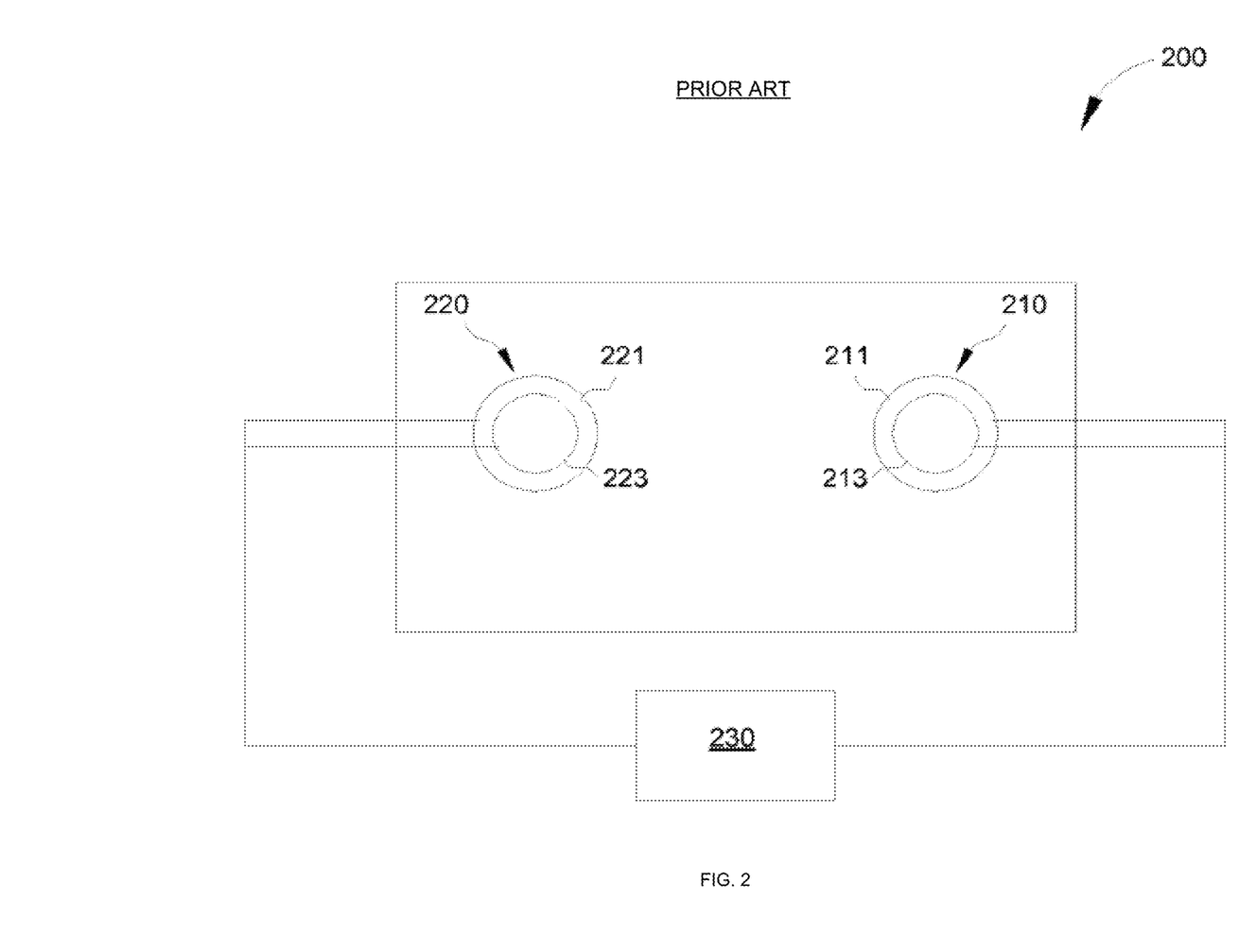
FIG. 2 is a top view of an illustrative embodiment of a prior art speaker cells array.

FIG. 2 is a top view of an illustrative embodiment of a prior art speaker array 200. Speaker array 200 can include a first speaker cell device 210 and a second speaker cell device 220. First speaker cell device 210 can include a first shutter 211 and a first membrane 213. First shutter 211 and first membrane 213 are both electrically coupled to controller 230. Controller 230 can be configured to apply a first signal to first shutter 211 and a second signal to first membrane 213. As set forth above, the moving frequency of first shutter 211 and the oscillation frequency of first membrane 213 can be associated with the first signal and the second signal, respectively. A first audio signal can be generated based on the movement of the first shutter 211 and the oscillating membrane 213.

Second speaker cell device 220 can include a second shutter 221 and a second membrane 223. Second shutter 221 and second membrane 223 are both electrically coupled to controller 230. Controller 230 can be configured to apply a third signal to second shutter 221 and a fourth signal to second membrane 223. As set forth above, the moving frequency of second shutter 221 and the oscillation frequency of second membrane 223 are associated with the third signal and the fourth signal, respectively. A second audio signal can be generated based on the movement of the second shutter 221 and the oscillating membrane 223.

When the moving frequencies of first shutter 211 and second shutter 221, and the oscillation frequencies of first membrane 213 and second membrane 223 are substantially the same, the first audio signal can be generated by first speaker cell device 210 and the second audio signal can be generated by second speaker cell device 220 have substantially the same frequency.

When the moving frequencies of first shutter 211 and second shutter 221 are different, or the oscillation frequencies of first membrane 213 and second membrane 223 are different, the first audio signal generated by first speaker cell 210 and the second audio signal generated by second speaker cell 220 have substantially different frequencies.

There is a growing need to reduce the energy consumption of all devices integrated in smartphones/mobile/wearable products, and MEMS speakers.

SUMMARY

According to an embodiment of the invention there may be provided a method of charge reuse, the method may include repeating the steps of electrically coupling a first group of capacitive loads to a second group of capacitive loads; wherein the capacitive loads of the first group and of the second group may be Microelectromechanical systems (MEMS) capacitive loads or Nanoelectromechanical systems (NEMS) capacitive loads; charging the second group with a first charge provided from the first group; electrically disconnecting the first group from the second group; operating the second group while using the first charge; electrically coupling the first group to the second group; charging the first group with a second charge provided from the second group; electrically disconnecting the first group from the second group; and operating the first group while using the second charge.

The capacitive loads of the first group and of the second group may be MEMS or NEMS speakers.

The first group and the second group may form an array of MEMS or NEMS speakers that may include an array of membranes and an array of shutters.

The first group may include a first portion of the array of membranes and a first portion of the array of shutters; the second group may include a second portion of the array of membranes and a second portion of the array of shutters.

The first group and the second group may be selectively coupled to each other by an inductance.

The first group and the second group may be selectively coupled to each other by an inductance; wherein an ultrasound frequency of signals outputted by the array of MEMS or NEMS speakers may not exceed a resonant frequency of a circuit that may include the inductance, the first group and the second group.

The first group and the second group may be selectively coupled to each other by an inductance; wherein a resonant frequency of a circuit that may include the inductance, the first group and the second group may well exceed an ultrasound frequency of signals outputted by the array of MEMS or NEMS speakers.

The method may include providing, by a supply unit, a supply charge to at least one of the first group and the second group.

Each one of the first group and second group may include capacitive loads that may be coupled to each other in parallel.

The capacitive loads of the first group and second group may be NEMS or MEMS actuators.

According to an embodiment of the invention there may be provided a device having charge-reuse capabilities, the device may include a first group of capacitive loads; a second group of capacitive loads; wherein the capacitive loads of the first group and of the second group may be Microelectromechanical systems (MEMS) capacitive loads or Nanoelectromechanical systems (NEMS) capacitive loads; and a coupling circuit; wherein the device is arranged to perform multiple repetitions of a sequence that may include a first configuration phase, a first operational phase, a second configuration phase and a second operational phase, wherein during the first configuration phase the coupling circuit is configured to (a) couple the first group to the second group thereby allowing the second group to be charged by a first charge that is provided from the first group and (b) following a charging of the second group by the first charge, electrically disconnect the first group from the second group; wherein during the first operational phase the second group is configured to operate while using the first charge; wherein during the second configuration phase the coupling circuit is configured to (a) couple the first group to the second group thereby allowing the first group to be charged by a second charge that is provided from the second group and (b) following a charging of the first group by the second charge, electrically disconnect the first group from the second group; and wherein during the second operational phase the first group is configured to operate while using the second charge.

The capacitive loads of the first group and of the second group may be MEMS or NEMS speakers.

The first group and the second group may form an array of MEMS or NEMS speakers that may include an array of membranes and an array of shutters.

The first group may include a first portion of the array of membranes and a first portion of the array of shutters; and wherein the second group may include a second portion of the array of membranes and a second portion of the array of shutters.

The first group and the second group may be selectively coupled to each other by an inductance.

The first group and the second group may be selectively coupled to each other by an inductance; wherein an ultrasound frequency of signals outputted by the array of MEMS or NEMS speakers may not exceed a resonant frequency of a circuit that may include the inductance, the first group and the second group.

The first group and the second group may be selectively coupled to each other by an inductance; wherein a resonant frequency of a circuit that may include the inductance, the first group and the second group may well exceed an ultrasound frequency of signals outputted by the array of MEMS or NEMS speakers.

The device may include a supply unit that is arranged to supply charge to at least one of the first group and the second group.

Each one of the first group and second group may include capacitive loads that may be coupled to each other in parallel.

The capacitive loads of the first group and second group may be NEMS or MEMS actuators.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a method should be applied mutatis mutandis to a system capable of executing the method.

Any reference in the specification to a system should be applied mutatis mutandis to a method that may be executed by the system.

The following text may refer to speakers arrays that are coupled to an inductor for charge-reuse. The speakers arrays may be regarded as non-limiting examples of a capacitive load.

According to various embodiment of the invention the charge reuse may be applied between one or more capacitive loads of a MEMS, especially a capacitive load of an output element of the MEMS that is arranged to generate an output signal, to actuate a mechanical element or alike, and one or more another capacitor. The one or more other capacitor may belong to the MEMS, to another element of a device that includes the MEMS and the like. For example—the one or more other capacitor may be part of a charge pump that feeds (at least during one period) the one or more capacitive loads or is not a part of such a charge pump.

Yet for another example—the capacitive load (that participates in the charge reuse) may represent any actuator that is based on a capacitor and the force is proportional to the electric field.

Examples of such actuators include electrostatic MEMs actuators such as charged plates (as in this disclosure) or comb drives.

Additional examples of such actuators are based on a piezoelectric actuation, examples include, bimorph actuators, and stacked piezo actuators. Additional examples include electro active polymers which are used in robotic applications providing artificial muscles. The charge reuse circuit described provides a benefit in any example where the system has low inherent dissipation of charge compared to the characteristic cycle of operation of the system. Hence virtually any system which uses capacitive loads, including electrostatic or piezoelectric actuation, can benefit from the charge reuse. Examples include—robots, non-oscillatory movement of actuators, non-resonant MEMS mirrors (e.g. for tracking objects rather than raster scanning) and microfluidic pumps.

Figure 4A:
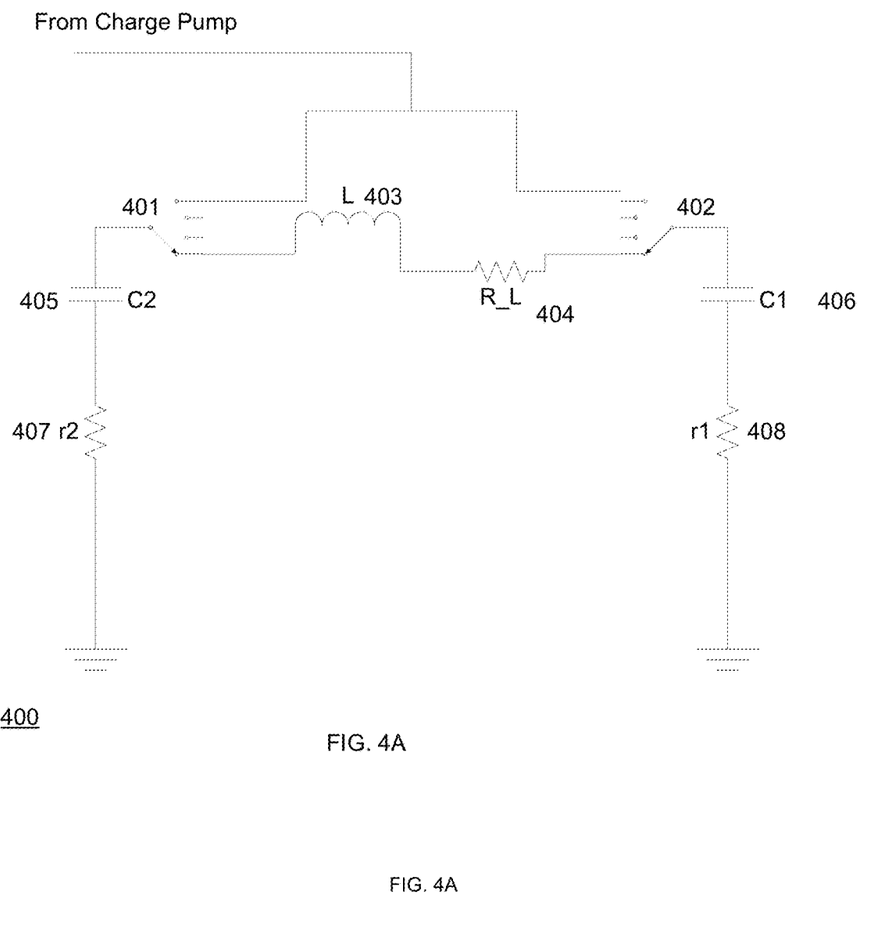
FIGS. 4A and 4B includes models of a charge reuse scheme according to an embodiment of the invention.
Figure 4B:
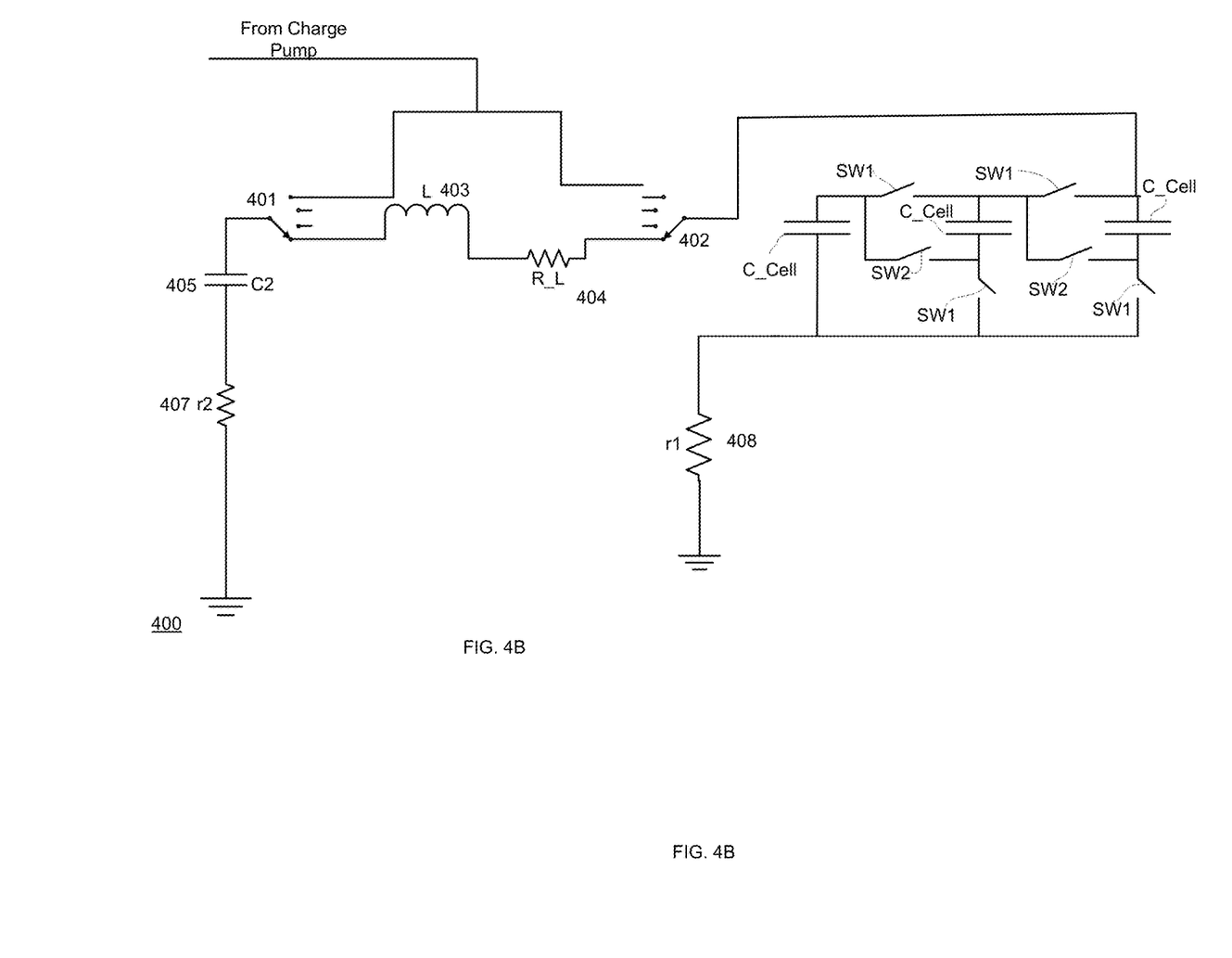

For such applications, the capacitor C1 in FIG. 4 may be a part of the system (e.g. capacitance of and actuator of a non-resonant MEMS mirror), while C2 may be not part of the system load (like in case of the speakers array), but an additional capacitor in which charge is stored when the C1 gets discharged through inductance L. When the C1 needs to charge again, the charge stored in C2 gets reused and re-charges the C1 through inductance L. The capacitor C2 may be implemented by a separate discrete capacitor device, or an integrated on-chip capacitor, or a capacitor implemented as part of the device package, e.g. on a PCB used in the device.

The circuit may also have an application in optimizing the performance of charge pumps. In such a case the capacitor C2 will belong to the Charge Pump final stage. The load C1 may be charged by connecting C2 to it directly, or through the inductance L. FIG. 4A shows such a configuration. The load capacitance here is comprised of multiple C_cell capacitors of the individual cells connected in parallel (Switches SW1 closed while SW2 are open). When the load needs to be discharged, the connection of the load capacitors C_Cell may be reconfigured to be in series, at least for sub-groups of them (Switches SW1 open, SW2 closed), and these may be connected to the capacitor C1 through inductance or directly.

The "basic" scheme for driving capacitive load is by charging and discharging the capacitor at the driving frequency (f). This scheme exhibits a loss of power at the rate of $CVout^2 f/2$. Where C is the capacitance of the capacitor and Vout is the output voltage.

The membranes and the shutters of the speaker array are capacitive loads.

The different speakers of the speaker array should be synchronized in terms of generated audio signal which results from "chopping" of the modulated membrane of the speaker array.

Thus, for different cells, the phase $\phi_0$ can differ, and even be opposite, i.e. $\phi_0=0$ for some, while $\phi_0=180°$ for other:

$$A(t)\cos(2\pi f_{US}t + \varphi_0) * \cos(2\pi f_{US}t + \varphi_0) = \frac{1}{2}A(t) + \frac{1}{2}A(t)\cos(4\pi f_{US}t + 2\varphi_0)$$

Wherein A(t) is and $f_{US}$ is the ultrasound oscillation frequency of the membrane.

This gives opportunity for charge reuse between the speaker cells themselves, thus reducing significantly the power consumption, and, to some extent, the size of the on-chip charge pump that may be still needed when the volume of the outputted signal of the array should be changed.

According to an embodiment of the invention the cells of the speaker cells array are partitioned into groups. Cells of different groups are coupled to each other in parallel. Different groups may be coupled to each other by a coupling module that may include one or more switching and an inductor to enable a resonantive charge reuse. The coupling module may selectively couple one group to the other.

The coupling module, as well as the introduction of phase change between the different groups of speakers, allows charge reuse between the different groups.

The different groups are also coupled to a charge pump. The charge pump may be required for compensating for losses and/or for providing additional charge—for example when increasing the volume of the output signal of the speaker array.

Figure 3:
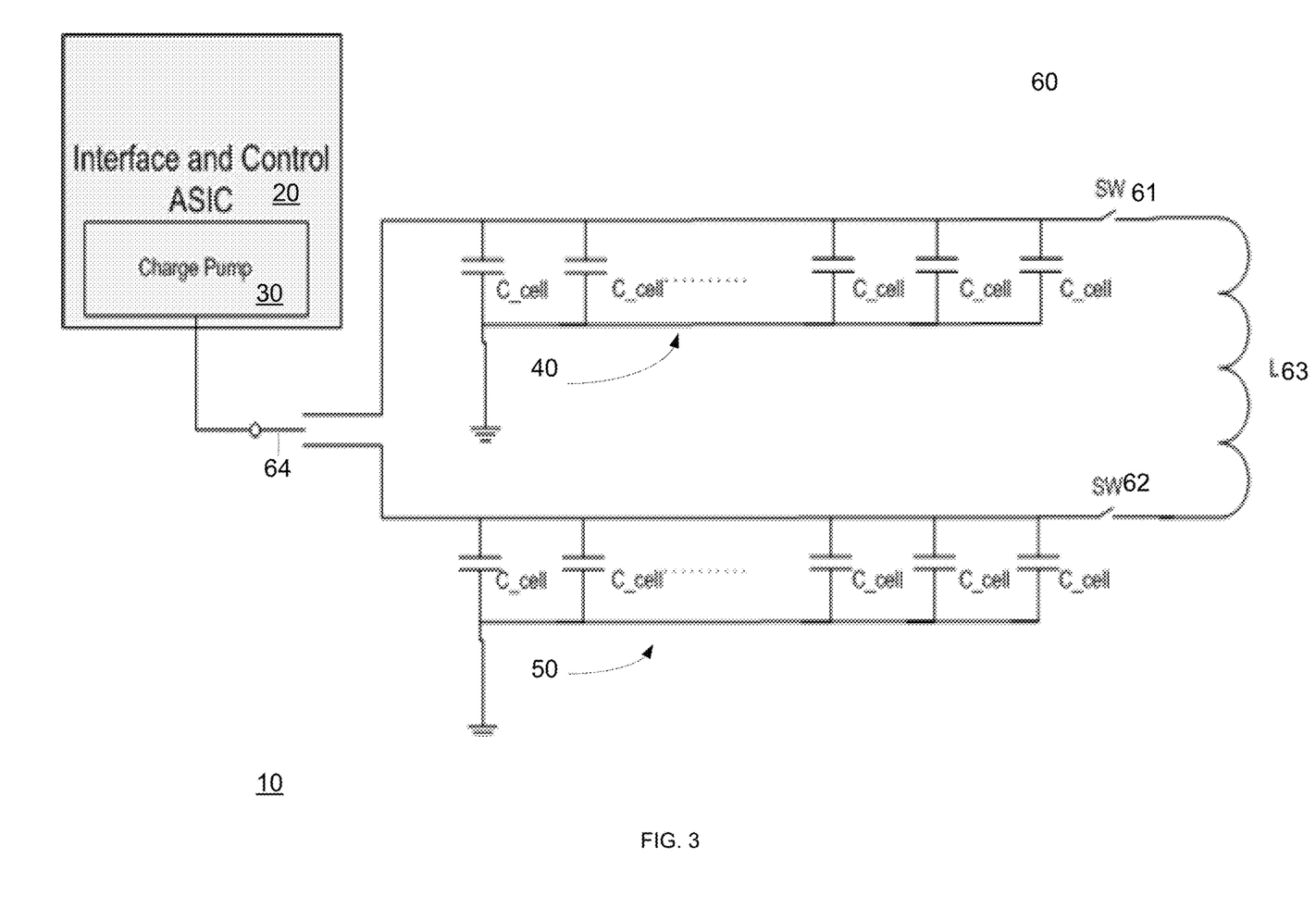
FIG. 3 illustrates a model of a switching circuit and an array of speaker cells that includes two groups and of speaker cells according to an embodiment of the invention.

FIG. 3 illustrates a model of a switching circuit and an array of speaker cells that includes two groups 40 and 50 of cells according to an embodiment of the invention. Each cell is represented in the model as a capacitor (C_cell)—that represents the capacitive load of the membrane and the shutter.

The speakers of group 40 are coupled to each other in parallel.

The speakers of group 50 are coupled to each other in parallel.

The input of groups 40 and 50 may be selectively connected (via switch 64) to the charge pump 30.

Switch 61 selectively connects group 40 to inductor 63 and switch 62 selectively connects group 50 to inductor 63. When switches 61 and 62 are closed croups 40 and 50 are coupled to each other via inductor 63 and charge reuse can be applied. The interface and control ASIC 20 (or any other controller) may send control signals to the different groups to that groups 40 and 50 receive (At least during some periods of time) signals that are phase shifted from each other (for example by 180 degrees) in order to enable charge reuse.

The interface and control ACIS 20 controls both the vibrations of the membrane and the chopping operation (the chopping operations performed by the shutter modulate the ultrasonic soundwaves outputted by the membrane).

It is noted that the resonant frequency of the circuit (including the capacitive loads of the speaker array and the inductor L may be close to the frequency of the ultrasound signal outputted by the membranes (for example 400 KHz), or much higher than this frequency. Using such a scheme of high resonant frequency may allow significant reduction in the inductor size.

Yet according to another embodiment of the invention the switching circuit can be without an inductor.

The charge reuse may be obtained when the speaker array and the switching circuit resonate or even when the speaker array and the switching circuit do not resonate.

FIG. 4A is a model of charge reuse scheme according to an embodiment of the invention.

In this model:
a. C1 405 and C2 406 are the capacities of the first and second groups of cells 40 and 50 (of FIG. 3) respectively.
b. r1 407 and r2 408 are parasitic resistances.
c. L 503 is the inductance of inductor 63.
d. R_L 504 is the resistance of inductor 63.

Switches 401 and 402 represent switches 61, 62 and 64 of FIG. 3.

The efficiency of the charge reuse is illustrated below:
Assumptions:
a. Static C1, C2 values, i.e. influence of charge on the value of capacitance (closing of capacitor plates) is ignored.
b. Values of r1, r2 are assumed constant.
c. The timing of switching is assumed perfectly matched. Error in timing of switching is ignored.
d. The problem to be considered is the efficiency of (i.e. proportion of) charge transfer between C1 and C2.
e. Initial conditions: C1 is charged to Q0 and C2 is discharged to 0.

Equations:

$$\frac{q_1}{C_1} + ir_1 + L\frac{di}{dt} + iR_L - \frac{q_2}{C_2} + ir_2 = 0 \quad (1)$$

$$i = \frac{dq_2}{dt} = -\frac{dq_1}{dt}$$

$$\Rightarrow \frac{d^2i}{dt^2} + 2\alpha\frac{di}{dt} + \omega_0^2 i = 0 \quad (2)$$

$$\alpha = \frac{r_1 + r_2 + R_L}{2L}; \quad \omega_0^2 = \frac{1}{L}\left(\frac{1}{C_1} + \frac{1}{C_2}\right)$$

Initial conditions:
$q_1(0)=Q_0$—initial charge on C1
$i(0)=0$—because of the inductor L
From the two above and the Equation (1):

$$\frac{di}{dt}(0) = \frac{Q_0}{LC_1}$$

Solution:

$$i(t) = \frac{Q_0}{\omega_1 LC_1} e^{-\alpha t} \sin(\omega_1 t),$$

$$\omega_1 = \sqrt{w_0^2 - \alpha^2}$$

$$q_2(t) = \int_0^t i(t)dt = \frac{Q_0}{\omega_1 LC_1} e^{-\alpha t} \sin(\omega_1 t - \emptyset),$$

$$\cos \emptyset = -\alpha \Big/ \sqrt{\alpha^2 + \omega_1^2} = \alpha/\omega_0$$

Maxima in $q_2(t)$ are located at points where $$i(t) = \frac{dq_2(t)}{dt} = 0,$$

or for $\omega_1 t = n\pi$ with n=2k-1. For n=1:

$$q_2(t = \pi/\omega_1) \cong Q_0 e^{-\alpha\pi/\omega_1} \frac{2}{1 + C_1/C_2}$$

Assuming C1=C2, $$q_2(t = \pi/\omega_1) = Q_0 e^{-\alpha\pi/\omega_1}$$

For efficient charge reuse we need $$\frac{\alpha\pi}{\omega_1} \ll 1,$$

or $\alpha \ll \omega_0 \Rightarrow$ $$L \gg C_1 \frac{(r_1 + r_2 + R_L)^2}{8} \quad \text{(Efficiency Condition)}$$

For $C_1$=5 pF, and calculating practical inductance parameters on a 3×3 mm^2 we get: L=0.11 uH, R_L=0.1 Ohm (assuming height of inductor wire 100 um and copper)

$$\Rightarrow (r_1 + r_2 + R_L) \ll \sqrt{\frac{8L}{C_1}} \approx 420 \text{ Ohm} \Rightarrow$$

$$\Rightarrow (r_1 + r_2) \leq 40 \text{ Ohm}$$

FIG. 4B illustrates a scenario where the capacitance C2 is not fully discharged when charge reuse is applied to move the charge back from the C_Cell capacitors to C2, it may be beneficial to connect the C_Cell capacitors in series instead of in parallel, thus achieving much higher voltage, thus forcing the charge to move from C_Cell capacitors back to C2. The Switches SW1 and SW2 are connected so that when SW1 is connected and SW2 are disconnected, C_Cell are connected in parallel, while when SW2 are connected and SW1 are disconnected, C_Cell are connected in series. Charging of C_Cell is performed with SW1, while charge reuse back to C2 is done when SW2 are connected.

Figure 5:
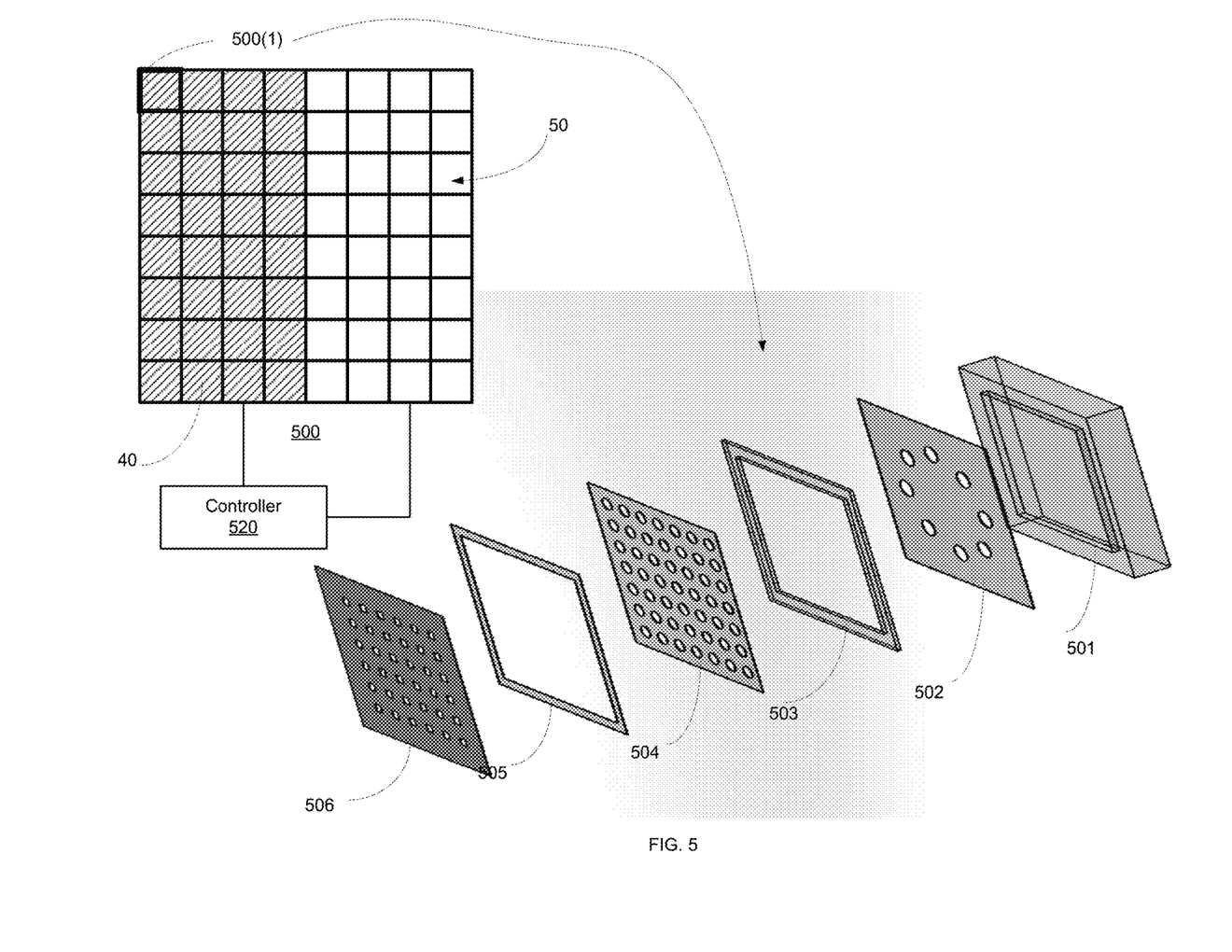
FIG. 5 illustrates a speaker based on an array of speaker cells and a single speaker cell according to an embodiment of the invention.

FIG. 5 illustrates an array 500 of speaker cells according to an embodiment of the invention.

Array 500 may include multiple cells. FIG. 5 illustrates one of the cells of the array—cell 500(1).

Array 500 is a rectangular array. Any other array (ordered arrays that are not rectangular shaped and/or non-ordered arrays may be provided.

FIG. 5 illustrates array 500 as including two groups of cells 40 and 50. It is noted that each group can be independently controlled (by controller 520) from each other, that there may be more than two groups and that the shape of each of the groups may differ from the rectangular shape illustrated in FIG. 5.

The first group may equal the second group. Alternatively—the first group may differ from the second group. For example—the first and second groups may have different number of speakers. The shape and/or size of two or more speakers of the first group may differ from the shape and/or size of two or more speakers of the second group.

The speaker 500(1) includes a housing 501, an interface 502, a first frame 503, a membrane 504, a second frame 505 and a shutter 506. These elements are connected to each other. The membrane 504 and the shutter 506 receive control signals from a controller.

Figure 6:
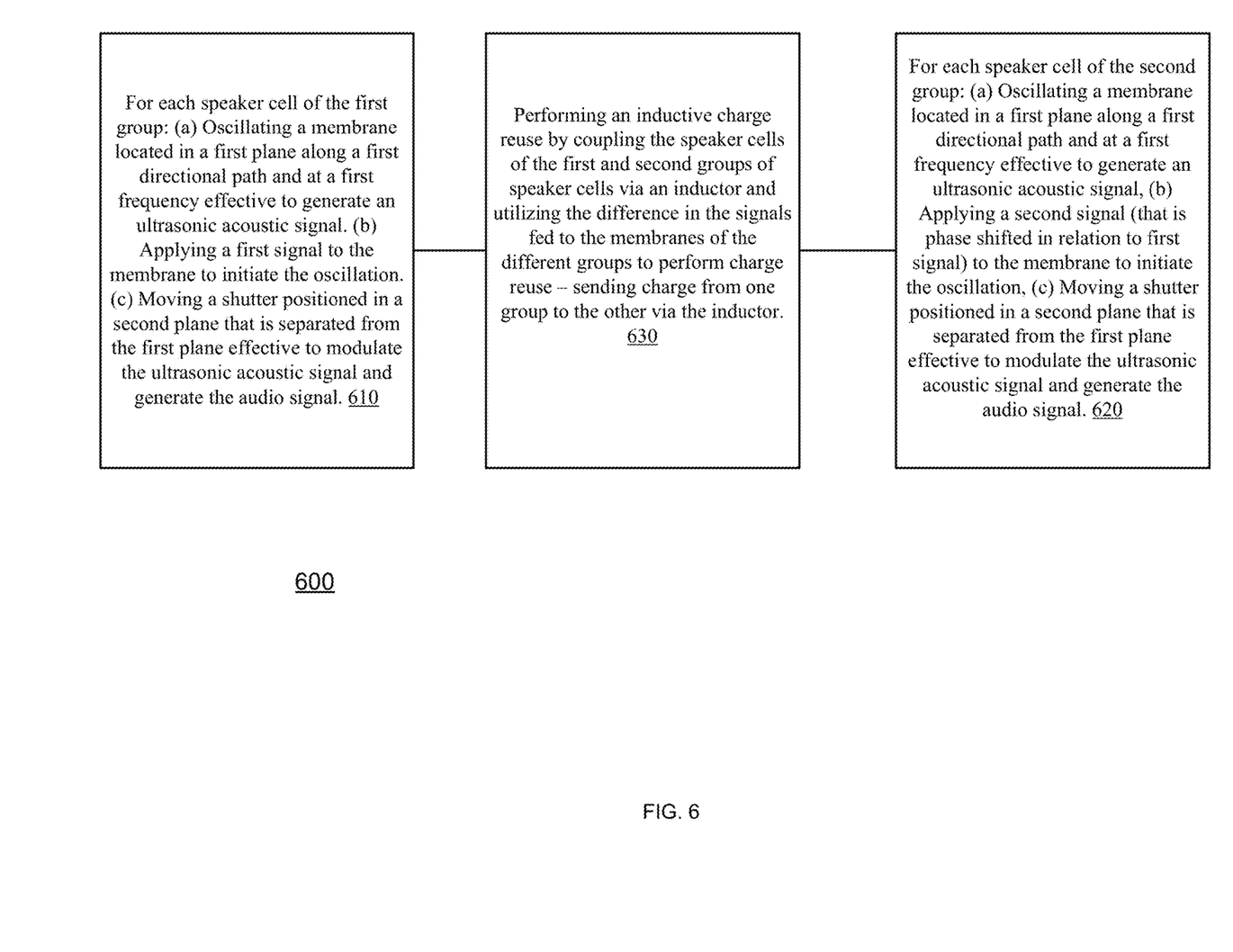
FIG. 6 illustrates a method according to an embodiment of the invention.

FIG. 6 illustrates method 600 according to an embodiment of the invention.

Method 600 may start by steps 610, 620 and 630.

Step 610 may include:
a. Oscillating one or more membranes of a first group of cells by supplying to the membranes a first signal.
b. Moving one or more associated shutters of the first group of cells to output a first audio signal. A membrane and a shutter are associated to each other if they belong to the same speaker.

Step 610 includes, for each cell of the first group:
a. Oscillating a membrane located in a first plane along a first directional path and at a first frequency effective to generate an ultrasonic acoustic signal.
b. Applying a first signal to the membrane to initiate the oscillation.
c. Moving a shutter positioned in a second plane that is separated from the first plane effective to modulate the ultrasonic acoustic signal and generate the audio signal. The shutter may move along a second directional path and at a second frequency. There may be any spatial relationship between the directions of the movements of the membrane and the shutter.
d. It is noted that the second frequency should match the carrier frequency of the membrane. The frequency of the membrane is modulated by the audio).

It is noted that the displacement of the shutter movement will typically cause change in the attenuation of the shutter between its open and closed position, thus allowing modulation of the ultrasound signal coming from the membrane. The frequency of the generated audio signal may be substantially equal to the difference between the first frequency and the second frequency. It is noted that in this Picospeaker an ultrasound signal is modulated by an audio signal coming from the membrane, and is modulated again by the shutter.

Step 610 may include:
a. Oscillating one or more membranes of a first group of speakers by supplying to the membranes a first signal.
b. Moving one or more associated shutters of the first group of speakers to output a first audio signal. A membrane and a shutter are associated to each other if they belong to the same speaker.

Step 620 includes, for each speaker of the second group:
a. Oscillating a membrane located in a first plane along a first directional path and at a first frequency effective to generate an ultrasonic acoustic signal.
b. Applying a second signal (that is phase shifted in relation to first signal) to the membrane to initiate the oscillation.
c. Moving a shutter positioned in a second plane that is separated from the first plane effective to modulate the ultrasonic acoustic signal and generate the audio signal.

Step 630 is executed in parallel to steps 610 and 620 and includes performing an inductive charge reuse by coupling the speakers of the first and second groups of speakers via an inductor and utilizing the difference in the signals fed to the membranes of the different groups to perform charge reuse—sending charge from one group to the other via the inductor.

Figure 7A:
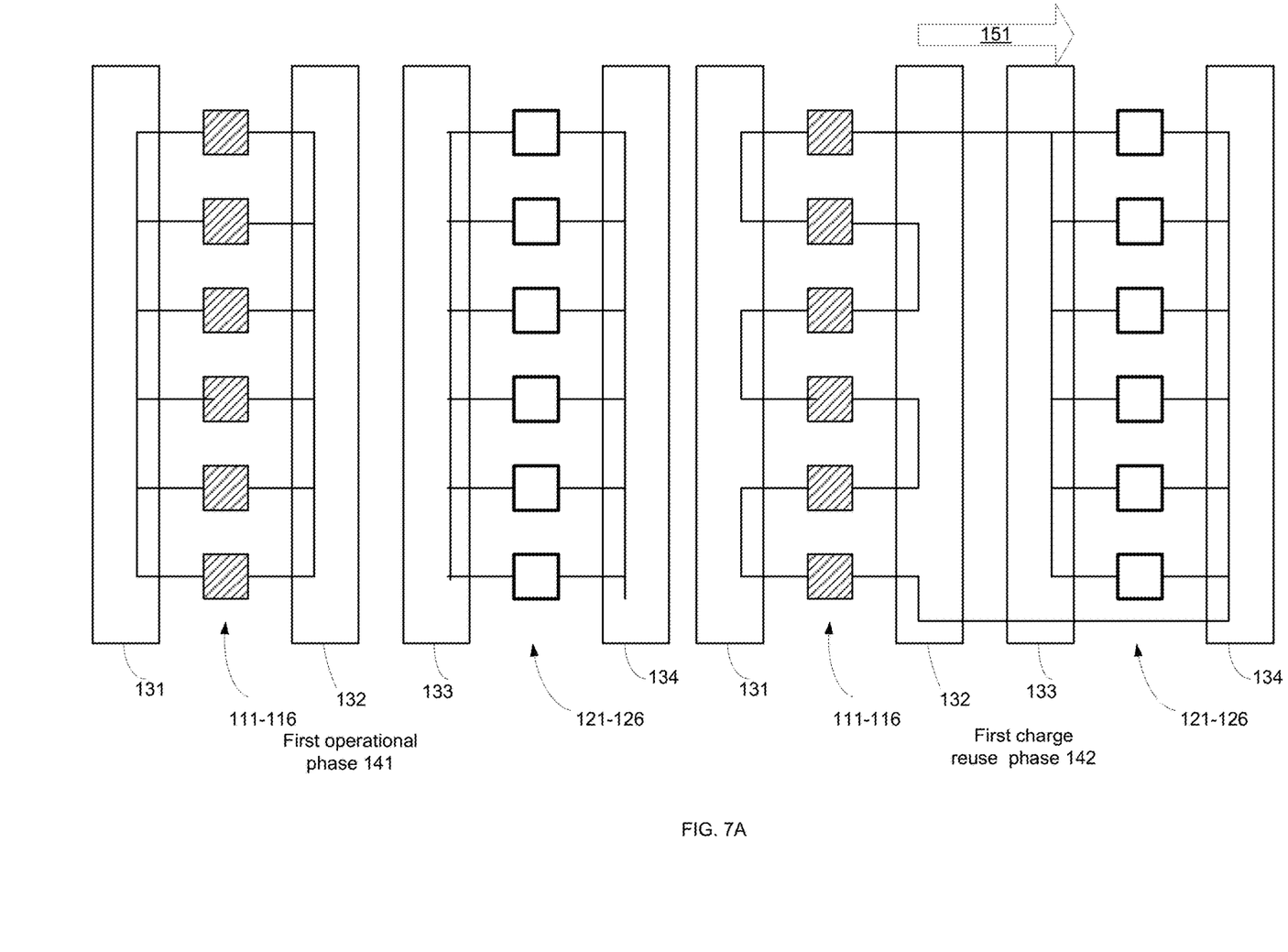
FIGS. 7A-7B illustrate a first set of capacitive loads, a second set of capacitive loads and coupling elements at four points in time according to various embodiment of the invention.
Figure 7B:
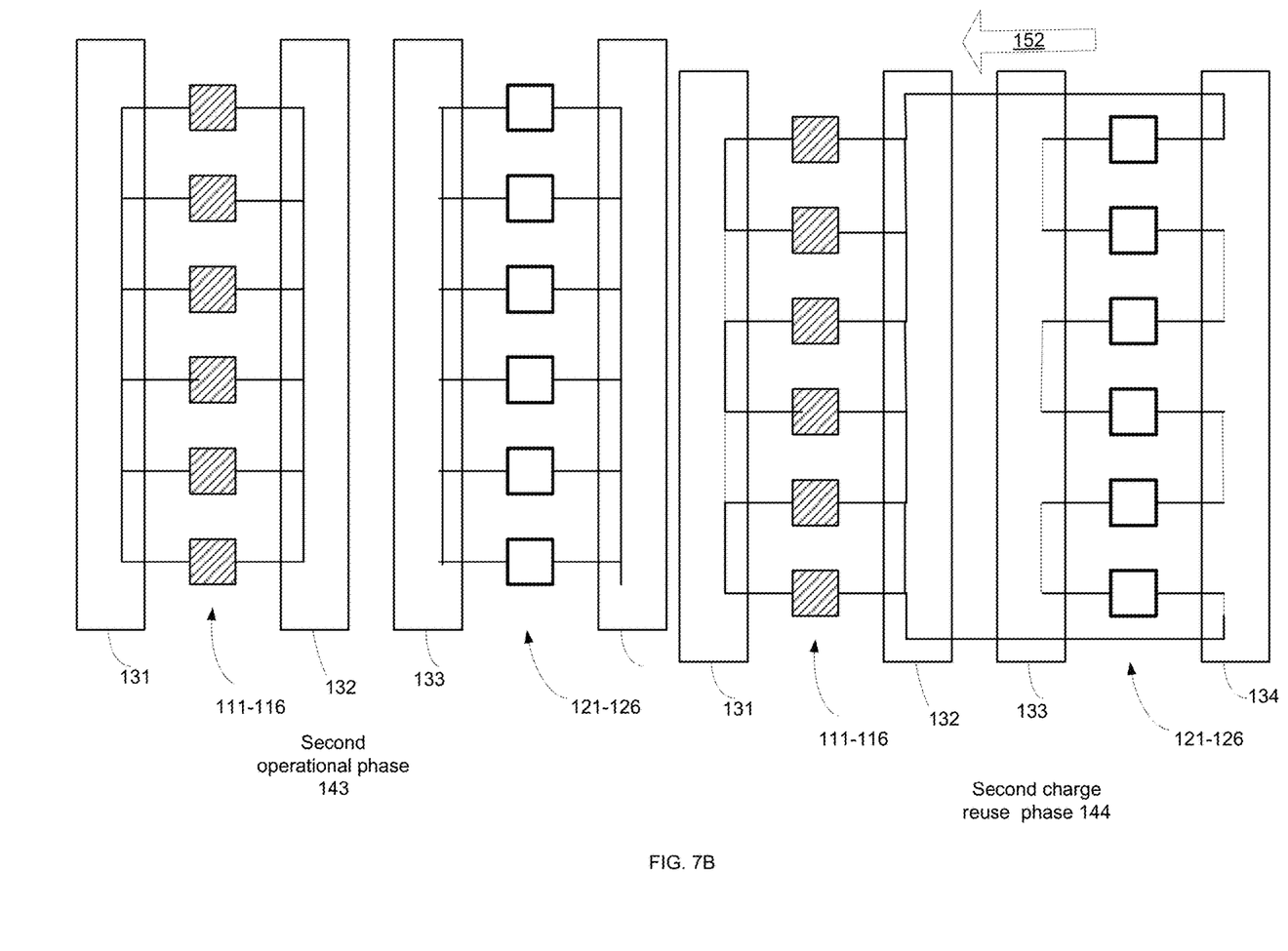

FIGS. 7A-7B illustrate a first set of capacitive loads 111-116, a second set of capacitive loads 121-126, and coupling elements 131 and 133 at four points in time according to various embodiment of the invention.

According to an embodiment of the invention the charge re-use may involve:
a. Coupling capacitive loads of a first set in parallel to each other and coupling capacitive loads of a second set in parallel to each other during a first operational phase 141 (for example—when outputting ultrasound signals). Each set of capacitive loads may receive its own input signal.
b. Coupling capacitive loads of the first set in series to each other, coupling capacitive loads of a second set in parallel to each other during a first charge re-use phase 142 and coupling the first set to the second set to allow a charge to be sent (151) from the first set to the second set.
c. Coupling capacitive loads of a first set in parallel to each other and coupling capacitive loads of a second set in parallel to each other during a second operational phase 143 (for example—when outputting ultrasound signals). Each set of capacitive loads may receive its own input signal.
d. Coupling capacitive loads of the first set in parallel to each other, coupling capacitive loads of a second set in series to each other during a second charge re-use phase 144 and coupling the first set to the second set to allow a charge to be sent (152) from the second set to the first set.

Figure 8:
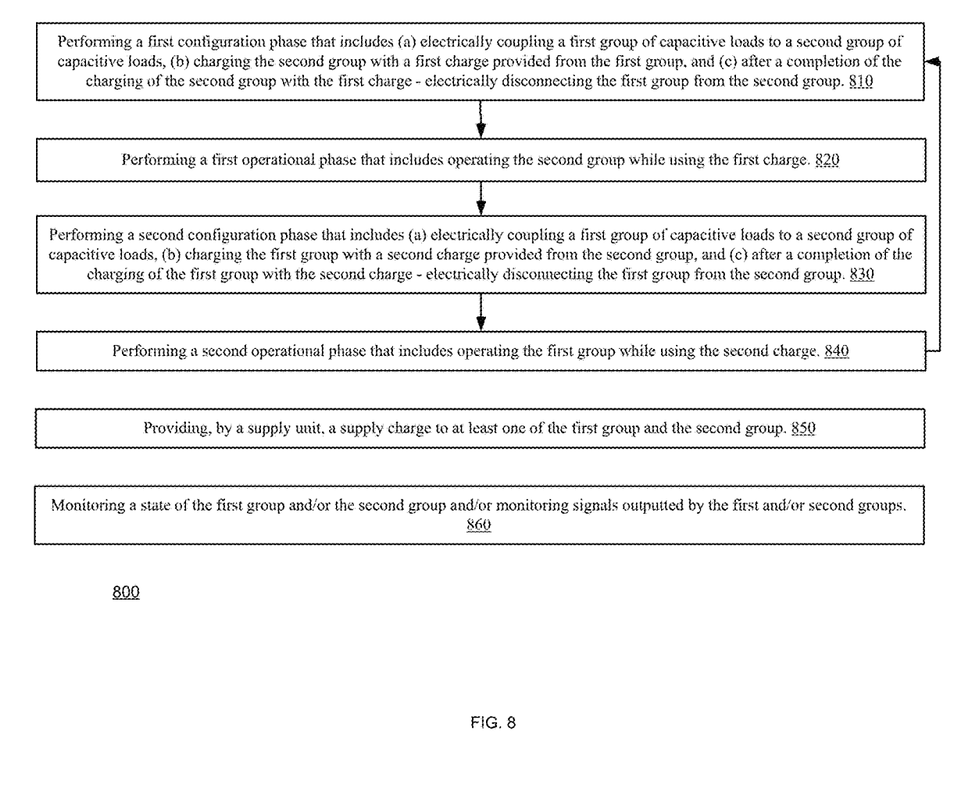
FIG. 8 illustrates a method according to an embodiment of the invention.

FIG. 8 illustrates method 800 according to an embodiment of the invention.

Method 800 may include executing multiple repetitions of steps 810, 820, 830 and 840. The repetitions are illustrated by jumping from step 840 to 810. The number of repetitions may be predetermined, the repetitions may continue while the device is operational.

Step 810 may include performing a first configuration phase that includes (a) electrically coupling a first group of capacitive loads to a second group of capacitive loads, (b) charging the second group with a first charge provided from the first group, and (c) after a completion of the charging of the second group with the first charge—electrically disconnecting the first group from the second group.

Step 820 may include performing a first operational phase that includes operating the second group while using the first charge. The operating may include, for example, outputting signals from NEMS or MEMS speakers of the second group, moving NEMS or MEMSE actuators of the second group, and the like.

Step 830 may include performing a second configuration phase that includes (a) electrically coupling a first group of capacitive loads to a second group of capacitive loads, (b) charging the first group with a second charge provided from the second group, and (c) after a completion of the charging of the first group with the second charge—electrically disconnecting the first group from the second group.

Step 840 may include performing a second operational phase that includes operating the first group while using the second charge. The operating may include, for example, outputting signals from NEMS or MEMS speakers of the first group, moving NEMS or MEMSE actuators of the first group, and the like.

The duration of the sequence may range between microseconds, milliseconds and even seconds.

Method 800 may also include step 850 of providing, by a supply unit, a supply charge to at least one of the first group and the second group. Step 850 may be executed per each repetition of steps 810, 820, 830 and 840, per a predefined number of repetitions, in a random manner, in a pseudo-random manner, according to a predefined pattern, based on events, and the like.

Step 850 may be executed during repetitions of steps 810, 820, 830 and 840 and/or between repetitions.

Step 850 may involve coupling the supply unit to the first and/or second groups.

Method 800 may include step 860 of monitoring a state of the first group and/or the second group and/or monitoring signals outputted by the first and/or second groups.

The monitoring may involve determining when charge losses resulting from the execution of steps 810, 820, 830 and 840 should be at least partially compensated—by the injection of the supply charge. In this case step 860 may be followed by step 850. Step 860 may determine the amount of supply charge to be provided during step 850.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method of charge reuse, the method comprises:
repeating the steps of:
electrically coupling a first group of capacitive loads to a second group of capacitive loads; wherein the capacitive loads of the first group and of the second group are Microelectromechanical systems (MEMS) capacitive loads or Nanoelectromechanical systems (NEMS) capacitive loads;
charging the second group with a first charge provided from the first group;
electrically disconnecting the first group from the second group;
operating the second group while using the first charge;
electrically coupling the first group to the second group;
charging the first group with a second charge provided from the second group;
electrically disconnecting the first group from the second group; and
operating the first group while using the second charge.

2. The method according to claim 1 wherein the capacitive loads of the first group and of the second group are MEMS or NEMS speakers.

3. The method according to claim 1 wherein the first group and the second group form an array of MEMS or NEMS speakers that comprises an array of membranes and an array of shutters.

4. The method according to claim 3 wherein the first group comprises a first portion of the array of membranes and a first portion of the array of shutters; and wherein the second group comprises a second portion of the array of membranes and a second portion of the array of shutters.

5. The method according to claim 3 wherein the first group and the second group are selectively coupled to each other by an inductance.

6. The method according to claim 3 wherein the first group and the second group are selectively coupled to each other by an inductance; wherein an ultrasound frequency of signals outputted by the array of MEMS or NEMS speakers does not exceed a resonant frequency of a circuit that comprises the inductance, the first group and the second group.

7. The method according to claim 3 wherein the first group and the second group are selectively coupled to each other by an inductance; wherein a resonant frequency of a circuit that comprises the inductance, the first group and the second group well exceeds an ultrasound frequency of signals outputted by the array of MEMS or NEMS speakers.

8. The method according to claim 1 comprising providing, by a supply unit, a supply charge to at least one of the first group and the second group.

9. The method according to claim 1 wherein each one of the first group and second group comprises capacitive loads that are coupled to each other in parallel.

10. The method according to claim 1 wherein the capacitive loads of the first group and second group are NEMS or MEMS actuators.

11. A device having charge-reuse capabilities, the device comprises:
a first group of capacitive loads;
a second group of capacitive loads; wherein the capacitive loads of the first group and of the second group are Microelectromechanical systems (MEMS) capacitive loads or Nanoelectromechanical systems (NEMS) capacitive loads; and
a coupling circuit;
wherein the device is arranged to perform multiple repetitions of a sequence that comprises a first configuration phase, a first operational phase, a second configuration phase and a second operational phase,
wherein during the first configuration phase the coupling circuit is configured to (a) couple the first group to the second group thereby allowing the second group to be charged by a first charge that is provided from the first group and (b) following a charging of the second group by the first charge, electrically disconnect the first group from the second group;
wherein during the first operational phase the second group is configured to operate while using the first charge;
wherein during the second configuration phase the coupling circuit is configured to (a) couple the first group to the second group thereby allowing the first group to be charged by a second charge that is provided from the second group and (b) following a charging of the first group by the second charge, electrically disconnect the first group from the second group; and
wherein during the second operational phase the first group is configured to operate while using the second charge.

12. The device according to claim 11 wherein the capacitive loads of the first group and of the second group are MEMS or NEMS speakers.

13. The device according to claim 11 wherein the first group and the second group form an array of MEMS or NEMS speakers that comprises an array of membranes and an array of shutters.

14. The device according to claim 13 wherein the first group comprises a first portion of the array of membranes and a first portion of the array of shutters; and wherein the second group comprises a second portion of the array of membranes and a second portion of the array of shutters.

15. The device according to claim 13 wherein the first group and the second group are selectively coupled to each other by an inductance.

16. The device according to claim 13 wherein the first group and the second group are selectively coupled to each other by an inductance; wherein an ultrasound frequency of signals outputted by the array of MEMS or NEMS speakers does not exceed a resonant frequency of a circuit that comprises the inductance, the first group and the second group.

17. The device according to claim 13 wherein the first group and the second group are selectively coupled to each other by an inductance; wherein a resonant frequency of a circuit that comprises the inductance, the first group and the second group well exceeds an ultrasound frequency of signals outputted by the array of MEMS or NEMS speakers.

18. The device according to claim 11 further comprising a supply unit that is arranged to supply charge to at least one of the first group and the second group.

19. The device according to claim 11 wherein each one of the first group and second group comprises capacitive loads that are coupled to each other in parallel.

20. The device according to claim 11 wherein the capacitive loads of the first group and second group are NEMS or MEMS actuators.

* * * * *